(12) United States Patent
Greitschus et al.

(10) Patent No.: US 6,680,645 B2
(45) Date of Patent: Jan. 20, 2004

(54) ACTIVE FILTER CIRCUIT WITH OPERATIONAL AMPLIFIER

(75) Inventors: Norbert Greitschus, Endingen (DE); Stefan Noe, Reutlingen (DE)

(73) Assignee: Micronas GmbH, Freiburg (DE)

( * ) Notice: Subject to any disclaimer, the term of this patent is extended or adjusted under 35 U.S.C. 154(b) by 0 days.

(21) Appl. No.: 09/977,574

(22) Filed: Oct. 15, 2001

(65) Prior Publication Data

US 2002/0101279 A1 Aug. 1, 2002

(30) Foreign Application Priority Data

Oct. 14, 2000 (EP) .......................................... 00122512

(51) Int. Cl.[7] .................................................. H03K 5/00
(52) U.S. Cl. ........................................ 327/553; 327/558
(58) Field of Search ................................ 327/552, 558, 327/553, 103

(56) References Cited

U.S. PATENT DOCUMENTS 6,008,635 A * 12/1999 Haefele et al. ............. 324/142
6,140,867 A * 10/2000 de Micheli et al. ......... 327/553
6,181,748 B1 * 1/2001 Lin et al. .................... 327/257
6,201,438 B1 * 3/2001 Nicollini et al. ............ 327/588

OTHER PUBLICATIONS

Mohan, "Predistortion of Friend's Single Amplifier Biquad," May 6, 1985, pp. 287–290.

Graeme, "Feedback Plots Offer Insight into Operational Amplifiers," Jan. 19, 1989, pp. 131–140.

Zuck and Knitter, "High–Speed op amps—They're in a Class by Themselves," Sep. 5, 1977, pp. 99–104.

* cited by examiner

Primary Examiner—Dinh T. Le
(74) Attorney, Agent, or Firm—Samuels, Gauthier & Stevens LLP

(57) ABSTRACT

An at least second-order active filter circuit includes an operational amplifier (Op) whose frequency response, in conjunction with an RC network ($R_1$, $R_2$, $C_1$, $C_2$), serves to set a predetermined low-pass characteristic. The frequency response of the operational amplifier (Op) forms an integral part of this low-pass characteristic.

2 Claims, 4 Drawing Sheets

ACTIVE FILTER CIRCUIT WITH OPERATIONAL AMPLIFIER

BACKGROUND OF THE INVENTION

The invention relates to the field of active filter circuits, and in particular to an active filter circuit with an operational amplifier which serves to construct higher-order low-pass filters.

Higher-order low-pass filters can be realized by cascading second-order sections or second-order sections and a first-order section without feedback. Such filter circuits avoid the use of inductors, but require an active circuit in the form of an idealized amplifier, which is generally an operational amplifier. With this idealized amplifier, active negative or positive feedback is implemented and the absence of feedback within and outside the respective low-pass filter is ensured.

Various realizations of second-order low-pass filters with operational amplifiers are known including for example, active filter circuits with three operational amplifiers (FIG. 1), active filter circuits with multiple negative feedback (FIG. 2), and active filter circuits with single positive feedback (FIG. 3). All these circuits realize the transfer function of a second-order low-pass filter with a known transfer function that can be expressed as:

$$G(p) = \frac{v'}{1 + a \cdot \frac{p}{\omega_g} + b \cdot \frac{p^2}{\omega_g^2}} \qquad \text{EQ. (1)}$$

where p=Laplace operator
$\omega_g$=cutoff frequency of low-pass filter
V'=passband gain of low-pass filter
a=first filter coefficient of transfer function
b=second filter coefficient of transfer function The dimensionless filter coefficients a and b of the transfer function G(p) are set by choosing appropriate parameters for the respective RC network. With these coefficients and by connecting such low-pass filters, generally filters with different filter coefficients, in series without feedback, filters with predetermined characteristics can be realized. Known examples of different filter types are Bessel, Butterworth, and Chebyshev filters. These filter types differ by the different filter coefficients $a_i$ and $b_i$. More detailed explanations can be found, for example, in U. Tietze and Ch. Schenk, "Halbleiter-Schaltungstechnik", 10th Edition, Springer-Verlag, 1993, ISBN 3-540-56184-6, in Chapter 14.1, "Theoretische Grundlagen von Tiefpaßfiltern", pages 391 to 413.

A disadvantage of these known circuits is that at a high cutoff frequency of the low-pass filter, the transfer function of the amplifier may influence the desired transfer function of the low-pass filter by its real frequency and phase characteristics. To avoid this or make the influence negligible, the transit frequency $f_T$ of the operational amplifier with negative feedback must be far outside the desired low-pass characteristic. The realization of a high cutoff frequency of the low-pass filter requires a transit frequency of the operational amplifier which is higher than the cutoff frequency of the low-pass filter by at least a factor of 20 to 100, depending on the accuracy required. The high-frequency charge reversal of the respective parasitic or load capacitances involves a high current drain of the operational amplifier. Therefore, the realization of the high transit frequency may not be possible at all.

Therefore, there is a need for an active filter circuit that provides an active low-pass filter with a defined characteristic for relatively high pass frequencies which avoids the disadvantage of the high current drain.

SUMMARY OF THE INVENTION

Briefly, according to an aspect of the invention, the frequency response of the operational amplifier contained in the active filter circuit into the frequency response of the low-pass filter rather than neglecting it.

The incorporation of the frequency response of the low-pass filter is accomplished selectively by specifying the transit frequency $f_T$ of the operational amplifier. This transit frequency being determined via the desired transfer function G(p) of the respective low-pass filter, which includes an RC network and at least one real operational amplifier with a frequency response. This permits the use of operational amplifiers with a relatively low transit frequency $f_T$ and, hence, with low current consumption.

These and other objects, features and advantages of the present invention will become more apparent in light of the following detailed description of preferred embodiments thereof, as illustrated in the accompanying drawings.

DETAILED DESCRIPTION OF THE INVENTION

Figure 1:
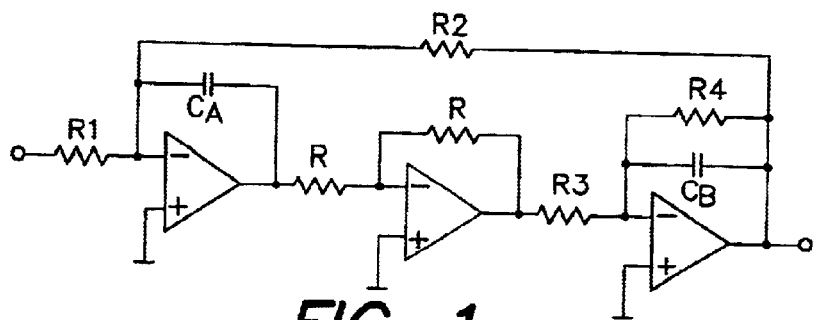
FIG. 1 illustrates a known filter circuit with three operational amplifiers.

FIG. 1 illustrates a known schematic circuit diagram of a relatively complex second-order low-pass filter with three operational amplifiers. The second order necessitates two time constants, which are determined by two capacitors $C_A$ and $C_B$ in conjunction with a plurality of (e.g., six) resistors R, R, $R_1$, $R_2$, $R_3$, and $R_4$.

Figure 2:
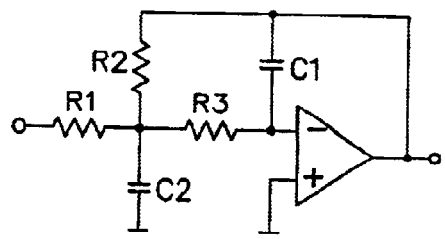
FIG. 2 illustrates a known filter circuit with multiple negative feedback.

FIG. 2 illustrates another known circuit diagram of a second-order active low-pass filter with multiple negative feedback. As a result of the multiple negative feedback, the circuit is simpler than that of FIG. 1 and requires only a single operational amplifier. The two time constants are formed by an RC network in the multiple negative feedback path which contains two capacitors $C_1$, and $C_2$ in conjunction with three resistors $R_1$, $R_2$, and $R_3$. By using node and mesh analysis techniques, the transfer function G(p) can be obtained. If the circuit is implemented using monolithic integrated circuit technology, care should be taken to ensure that the capacitors and resistors have reasonable values.

Figure 3:
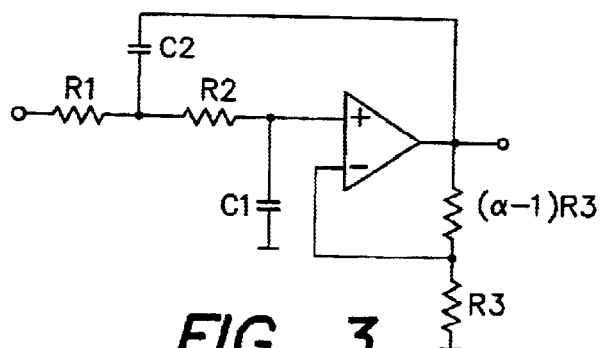
FIG. 3 illustrates a known filter circuit with single positive feedback.

FIG. 3 shows a likewise known circuit diagram of a second-order active low-pass filter with single positive feedback. Here, too, two capacitors $C_1$, and $C_2$ in conjunction with four resistors $R_1$, $R_2$, $(\alpha-1)R3$, and $R_3$ determine the two time constants.

FIGS. 1–3 simply illustrate that there are many ways to realize second-order active low-pass filters. For all the circuit variants, the above transfer function G(p) according to EQ. (1) applies. However, the operational amplifier is assumed to be ideal, that is, at least it does not have a frequency-dependent transfer function in the frequency range of interest or the latter is negligible in the frequency range of interest. Conversely, by substituting the desired filter parameters a and b and by a coefficient comparison with the circuit-dependent transfer function, the general transfer function G(p) yields the conditional equations for the capacitors and resistors contained in the respective RC network. By "circuit-dependent transfer function" is to be understood the transfer function in which the elements of the respective RC network are present as actual values and not in generalized, normalized form.

The values of the RC elements can be obtained by a coefficient comparison. However, the operational amplifier is not considered an ideal amplifier with infinite gain and infinite cutoff frequency. The gain is a frequency-dependent variable which is defined in simplified form by its transit frequency $f_T$ or $\omega_T$. This gives a system of equations which contains the interdependent elements of the RC network and the transit frequency. By specifying individual elements, the other elements can then be calculated via the individual conditional equations.

An advantage in the case of monolithic integration is the possibility of joint variation of values of the individual elements, so that with a suitable circuit design, manufacturing variations will hardly affect the characteristic of the low-pass filter, even if several stages are connected in series. Also, the capacitors, unlike discrete components, are arbitrarily finely gradable. When determining the individual elements, the individual values are balanced one against the other in order to find an optimum taking into account suitability for integration and accuracy.

Figure 4:
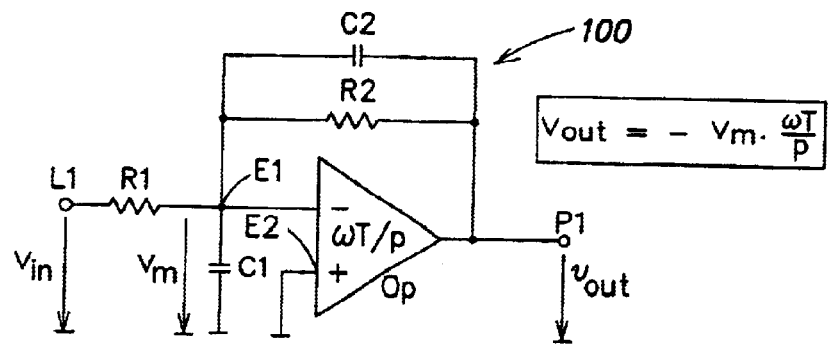
FIG. 4 is a block diagram illustration of an embodiment of the invention.

The incorporation of the operational amplifier's frequency response into the transfer function of the filter in accordance with an aspect the present invention will now be explained with the aid of the circuit example of FIG. 4. Referring to FIG. 4, the transfer function $G(p)=v_{out}/v_i$ of active filter 100 is determined by a node and mesh analysis. This is done using a node voltage $V_m$ appearing at a central node which also forms the inverting input E1 of the operational amplifier Op. All currents of node E1 can be determined with correct signs by node analysis, with the inverting input of the implemented operational amplifier Op considered to be at zero current. Since the sum of all currents entering or leaving node E1 is zero, one obtains $$(v_m - v_{out}) \cdot \left( \frac{1}{R_2} + p \cdot C_2 \right) = -v_m \cdot p \cdot C_1 + \frac{v_{in} - v_m}{R_1} \quad \text{EQ. (2)}$$

The frequency response of operational amplifier Op is taken into account approximately by specifying its transit frequency $f_T$. The associated angular frequency is $\omega_T = 2\pi f_T$. The input voltage of the operational amplifier Op, the node voltage $v_m$, is linked with its output voltage $v_{out}$ via the transit frequency:

$$v_{out} = \frac{\omega_T}{p} \cdot v_m \quad \text{EQ. (3)}$$

From Eqs. 2 and 3, the circuit-dependent transfer equation $G(p) = v_{out}/v_{in}$ can be rewritten as, obtained, which only contains the elements of the circuit of FIG. 4:

$$G(p) = -\frac{R_2}{R_1} \cdot \frac{1}{\left(1 + \frac{p}{\omega_T}\right) \cdot (1 + p \cdot R_2 C_2) + \frac{p}{\omega_T} \cdot \left(p \cdot C_1 R_2 + \frac{R_2}{R_1}\right)} \quad \text{EQ. (4)}$$

With the substitution of
 $v'=R_2/R_1$ passband gain of low-pass filter
 $\tau_1 = R_1 \cdot C_1$ first time constant
 $\tau_2 = R_2 C_2$ second time constant
for the coefficient comparison with the basic EQ. 1 of the transfer function, EQ. 4 can be rewritten as:

$$G(p) = \frac{-v'}{\left(1 + p \cdot \left(\tau_2 + \frac{1+v'}{\omega_T}\right)\right) + p^2 \cdot \left(\frac{\tau_2}{\omega_T} + \tau_1 \cdot \frac{v'}{\omega_T}\right)} \quad \text{EQ. (5)}$$

The coefficient comparison between EQ. 1 and EQ. 5 provides the characteristic coefficients a and b for the respective low-pass filter and the respective filter cutoff frequency $\omega_g$ as a function of v', $\tau_1$, $\tau_2$, and $\omega_T$:

$$a = \omega_g \cdot \left(\tau_2 + \frac{1+v'}{\omega_T}\right) \quad \text{EQ. (6)}$$

$$b = \omega_g^2 \cdot \frac{\tau_2 + v' \cdot \tau_1}{\omega_T} \quad \text{EQ. (7)}$$

Given the input resistance $R_1$ and the transit frequency $\omega_T$, the other elements of the RC network of FIG. 4 follow as a function of the desired filter cutoff frequency $\omega_g$ from the following equations:

$$R_2 = v' R_1 \quad \text{EQ. (8)}$$

$$C_2 = \frac{1}{R_2} \cdot \left(\frac{a}{\omega_g} - \frac{1+v'}{\omega_T}\right) \quad \text{EQ. (9)}$$

$$C_1 = \frac{b \cdot \omega_T}{R_2 \cdot \omega_g^2} - C_2 \quad \text{EQ. (10)}$$

Figure 5:
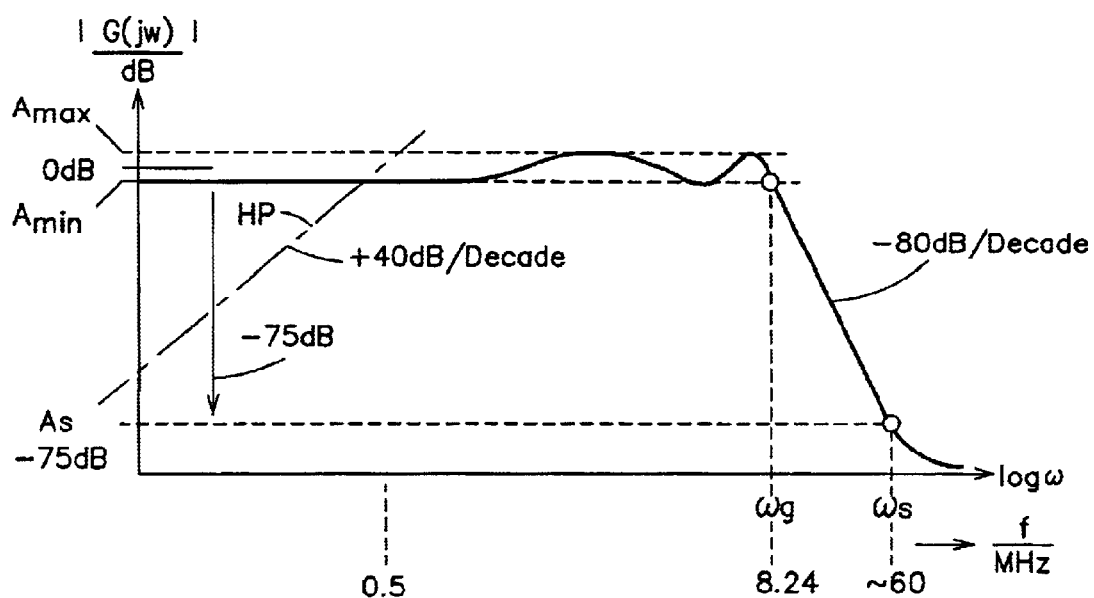
FIG. 5 illustrates a frequency-response plot for a fourth-order low-pass filter.

The reduction of the necessary transit frequency of the operational amplifiers will now be explained with reference to an embodiment illustrated by the schematic frequency-response plot of FIG. 5. The plot illustrates a double logarithmic representation of the frequency response $|G(j\omega)|$ of a fourth-order Chebyshev low-pass filter which is realized using two series-connected second-order low-pass filters. This filter has a steep skirt near the cutoff frequency $\omega_g$. The ratio of the two values $A_{max}$ and $A_{min}$ in the passband, which have to be specified, is called "ripple ".In the embodiment shown, the amount of ripple is small, namely $A_{max}/A_{min}=0.01$ dB. The far-off attenuation is determined by the fourth-order design of the low-pass filter and exhibits a frequency response of −80 dB/decade. If, in the transition region from the 2•8.24-MHz cutoff frequency $\omega_g$ to a far-off frequency $\omega_s$ of about 2•60 MHz, the level of the passed signals is to be lowered to approximately −70 dB, the amplitude and phase response of the active filter must correspond to the predetermined characteristic at least within this frequency range.

If, in addition, the DC voltage and low signal frequencies (e.g., frequencies below 500 kHz) are to be suppressed, these frequency ranges can be attenuated, for example, by one or two series-connected high-pass filters. This is represented in FIG. 5 by the dash-dotted high-pass skirt HP, which exhibits a frequency response of +40 dB/decade. Such high-pass filters are easily combinable with the active low-pass filter, for instance by inserting a capacitor between the respective filter input and resistor R1.

In the embodiment being described, the amount of ripple of the low-pass Chebyshev filter is to be $A_{max} A_{min}$=0.01 dB. The predetermined cutoff frequency $\omega_g$ is to be 2•8.24 MHz. Because of the desired ripple, the −3 dB cutoff frequency is higher, namely approximately 12 MHz. With the required far-off frequency $\omega_s$, the active low-pass filter covers a frequency range up to about 2π•60 MHz, which is well above the filter cutoff frequency $\omega_g$=2•8.24 MHz. If the transit frequency of the operational amplifier is to be negligible in view of the frequency response of the RC network, a factor of as little as twenty (20) above the filter cutoff frequency $\omega_g$ would result in a transit frequency $f_T$=164.8 MHz, which can be realized with conventional monolithic integrated technologies only with a high current drain of the operational amplifier. According to an aspect of the invention, the filter can be realized with a substantially lower transit frequency for the operational amplifier. The desired frequency attenuation is achievable with an active filter circuit whose operational amplifier only requires a transit frequency in the range of 60 MHz.

Figure 6:
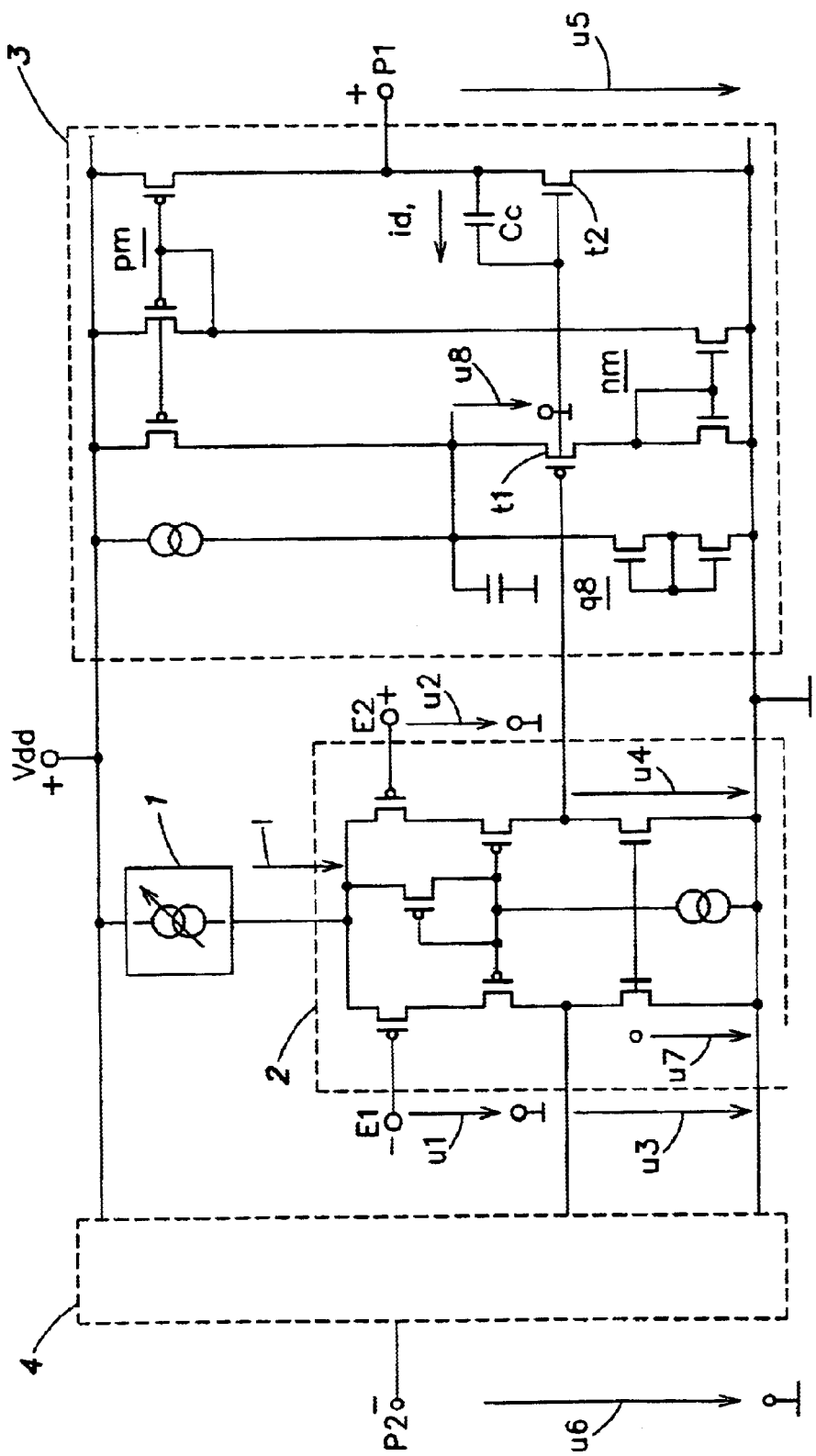
FIG. 6 illustrates an embodiment of a balanced operational amplifier.

FIG. 6 illustrates a circuit diagram of an operational amplifier Op in CMOS technology which can be used as an amplifier in an active filter circuit. The example shown is largely symmetrical so as to be as insensitive to parasitics as possible, particularly if the latter are produced on the same chip with other subcircuits.

The circuit diagram of FIG. 6 shows four circuit blocks. A first block 1 contains a biasing circuit for generating an impressed current I for a balanced input amplifier shown in block 2. Blocks 3, 4 are symmetrical with respect to each other and each form an output amplifier connected to input amplifier 2. As the second output amplifier 4 is symmetrical with respect to the first output amplifier 3, the internal circuit of the second output amplifier 4 is not shown in FIG. 6.

To form an inverting input E1 and a noninverting input E2, input amplifier 2 includes a differential input stage in the form of a p-channel transistor pair, which is supplied from a current source, namely transistor t7 (see FIG. 9) in biasing circuit 1. By controlling the output current I in biasing circuit 1, the transconductance $g_m$ of input amplifier 2 can be varied. The two inputs E1, is E2 are fed by a difference signal or a first and a second input voltage u1, u2. The differential input stage is connected via a p-channel cascode transistor pair to an n-channel current bank as a highly resistive load for coupling out a differential output voltage or two associated output voltages referred to ground, u3, u4. The gate voltage of the n-channel current bank is fixed by an auxiliary voltage u7. The magnitude of the differential output voltage or of the output voltages u3, u4 is dependent both on the differential input voltage $v_n$=u1−u2 (see FIGS. 4–7) and on the current I injected by biasing circuit 1.

The output signals u3, u4 of input amplifier 2 serve as inputs to the two output amplifiers 3, 4, whose output voltages u5, u6 form the output voltages of the balanced operational amplifier Op and the second-order filter stage. The two push-pull output stages 3, 4 are preferably implemented with the class-AB push-pull circuit illustrated in block 3 of FIG. 6, because such a circuit exhibits good linearity between the differential output current id formed at node P1 and the gate-source control voltage u4 of the complementary output transistor pair t1, t2. The operation of the class-AB push-pull circuit shown in FIG. 6, comprising two series-connected current mirrors nm, pm and a voltage source q8 for the fixed source potential u8 of transistor t1, is described in detail in applicant's Patent Application EP 0 460 263 A1. The capacitive negative feedback used in output stages 3, 4 provides classical frequency compensation on the Miller principle; cf. the Miller capacitor Cc in output stage 3. In this way, the requirement of a defined attenuation of −20 dB/decade can be satisfied. The transfer function $G_{Op}(p)$ of the operational amplifier can be described approximately by $$G_{Op}(p) = \frac{g_m}{p \cdot C_c} = \frac{\omega_T}{p} \qquad \text{EQ. (11)}$$

Figure 7:
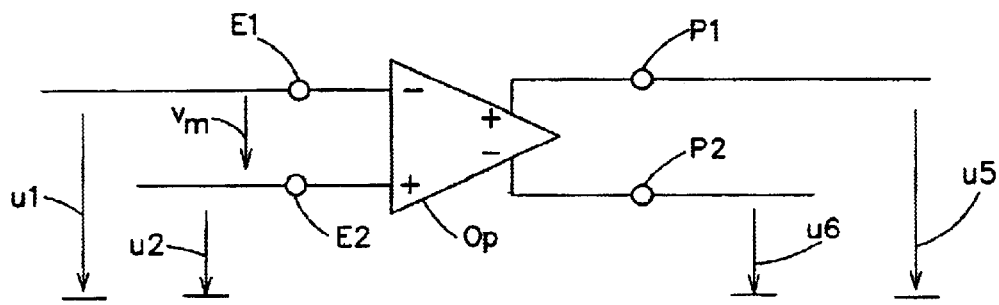
FIG. 7 is the symbol representation belonging thereto.

FIG. 7 illustrates schematically the symbol representation for the balanced operational amplifier of FIG. 6 with the inputs E1, E2 for voltages u1, u2 and the outputs P1, P2 for voltages u5, u6.

Figure 8:
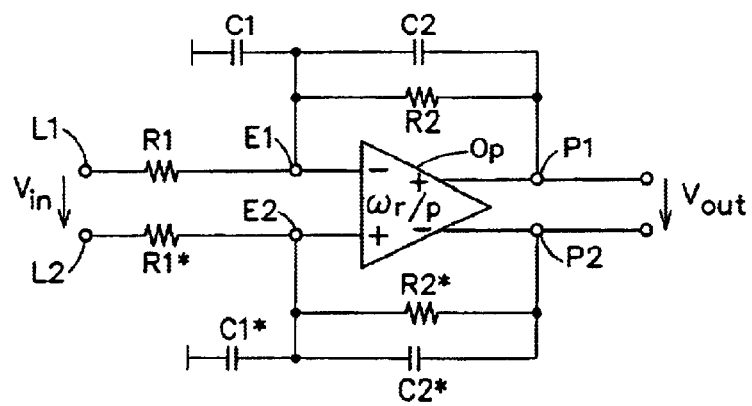
FIG. 8 is a schematic illustration of an active low-pass filter of symmetrical design.

FIG. 8 illustrates an addition to the single-ended low-pass circuit of FIG. 4 to form a fully symmetrical low-pass filter circuit. This is made possible by the balanced operational amplifier Op of FIGS. 6 and 7, whose two outputs P1, P2 correspond to a noninverting output and an inverting output, respectively. The symmetrically added components are marked in FIG. 8 with an asterisk (*), that is R1*, C1*, R2* and C2*. The frequency response is not affected by the symmetrization.

Figure 9:
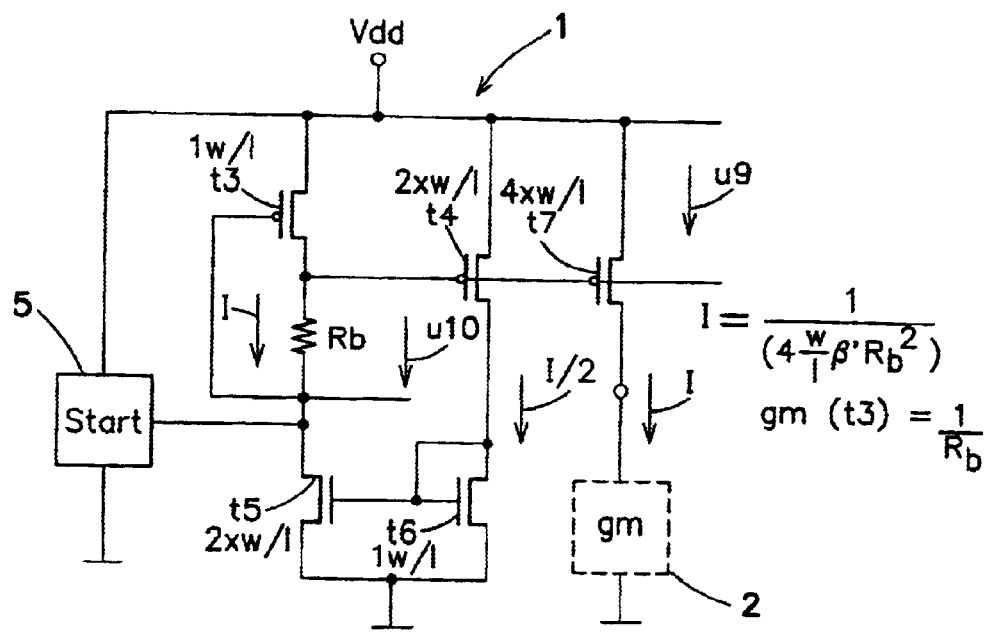
FIG. 9 shows an embodiment of a biasing circuit for transconductance control.

FIG. 9 illustrates an embodiment of biasing circuit 1. To generate a predetermined current I, biasing circuit 1 includes a control circuit that includes two cross-coupled currents mirrors of different polarities. The first current mirror contains p-channel transistors t3, t4, and the second current mirror contains n-channel transistor t5, t6. Transistors t3 and t6 are connected as diodes and define the currents of the associated current mirrors. The cross-coupling of the transistors is accomplished via the drain paths of transistors t3, t5 and t4, t6. The p-channel current mirror differs from the conventional current mirror circuit configuration in that different gate-source voltages are provided for the two transistors t3, t4. In the steady state of the embodiment illustrated in FIG. 9, the gate-source voltage of the diode-connected transistor t3 is twice as large as the gate-source voltage of transistor t4. This is forced by a resistor Rb in the drain current path of transistor t3. Across this resistor, the drain current produces a voltage drop which, in the steady state, is equal in magnitude to the gate-source voltage of transistor t4. To form the current mirror control diode, the gate terminal of transistor t3 is connected to the drain terminal not directly as usual, but after resistor Rb. Thus, the voltage drop produced across resistor Rb by the drain current adds to the voltage at the drain terminal. The gate terminal of transistor t4 is connected to the drain terminal of transistor t3, not to its gate terminal as usual.

Via their interconnected drain-source paths, transistors t3 and t5 provide a first current path, and transistors t4 and t6 provide a second current path. By selecting different w/l ratios of transistors t3, t4 and t5, t6, the transfer ratio between input current and output current is defined in each current mirror. In the case of the first current mirror t3, t4, however, the different gate-source voltages must additionally be taken into account. The different gate-source voltages force different current densities in the two transistors t3, t4. Since the magnitude of the gate-source voltage difference depends on the current in the first current path, the respective current densities and, thus, the current transfer ratio of the first current mirror t3, t4 also depend on this current.

In the embodiment of the biasing circuit of FIG. 9, the w/l ratios of transistors t3 and t4 and of transistors t5 and t6 are 1:2 and 2:1, respectively. Hence, the second current mirror forces currents in a ratio of 2:1 in the first and second current paths. As the w/l ratio of transistors t3 and t4 in the first current mirror is 1:2, a current density of 1:4 results for the currents transistors t3 and t4. Because of the quadratic dependence of the drain current on the gate-source voltage in the case of MOS transistors, this state in the first current mirror is only true for those operating in states in which the gate-source voltage of transistor t3 is twice as large as that of transistor t4. Since the two interconnected current mirrors form a control circuit, this stable state appears as a function of the value of resistor Rb and independently of the magnitude of the supply voltage Vdd for an operating state which is defined by the current value I. Thus, the current I is ultimately a function of Rb. In the steady state, a controlled current of value I flows in the first current path and a controlled current of value I/2 flows in the second current path. The magnitude of the current I is given by $$I = \frac{1}{4\frac{w}{l}\beta' \cdot R_b^2} \qquad \text{EQ. (12)}$$

where β' is a technology parameter indicative of the gate-oxide thickness and the mobility of the charge carriers in the channels of transistors t3, t4, and which thus defines a manufacturing-process-dependent transconductance of these transistors. Transistors t3 and t4 are preferably of the same conductivity type and have an operating point similar to that of the transconductance-determining input transistors of the transconductance input amplifier 2 in operational amplifier Op. Via other w/l ratios and other gate-source voltage ratios of transistors t3, t4, other current ratios than I and I/2 can of course be set. With I and I/2 a transconductance $g_m^*$ which is inversely proportional to $R_b$, is obtained for transistor t3 with the current I. Since the current source transistor t7 supplies input amplifier 2 with a current I equal to the current I in the first current path t3, t4 of biasing circuit 1, the transconductance $g_m$ of input amplifier 2 is inversely proportional to the value of the current-determining resistor $R_b$ in the first current path t3, t4.

$$g_m \propto g_m^* = 1/R_b \qquad \text{EQ. (13)}$$

To optimally adapt the transit frequency $f_T$ of operational amplifier Op to the resistances and capacitances of the RC network, it is recommended to implement the transconductance-determining resistor Rb of biasing circuit 1 with the same fabrication processes as the resistors and capacitors of the external negative-feedback network as well as the Miller capacitor of operational amplifier Op. In this manner, synchronism is achieved between the transit frequency $f_T$ of the operational amplifier and the reciprocal values of the RC time constants of the negative feedback (i.e., $2f_T = g_m/C$).

To pull the closed-loop control circuit in biasing circuit 1 from the zero-current operating point on turn-on of the supply voltage Vdd, a starting device 5 is necessary. It may include, for example a grounded high-value resistor through which flows a current which is very small compared to the current I but suffices to start the closed loop. This current may be turned off in the normal operating state, for example via a switch controlled by the first current mirror t3, t4 or the second current mirror t5, t6.

Figure 10:
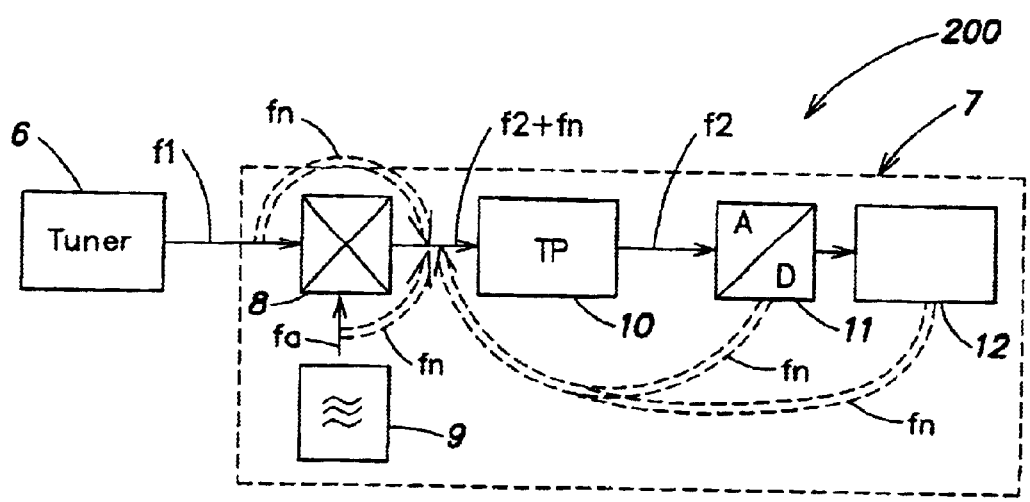
FIG. 10 is a block diagram illustration of an application of the low-pass filter.

FIG. 10 is a block diagram illustration of an active filter circuit 200. A tuner 6 provides at its output a frequency mixture at an intermediate-frequency value. This frequency mixture contains a channel of interest, which is subsequently processed with a monolithic integrated circuit 7. In this embodiment, this channel is in the 40-MHz range and is assigned to a carrier of frequency f1. The channel of interest is filtered out of the frequency mixture either in the tuner or by a surface-wave filter (not shown). At its input the monolithic integrated circuit 7 contains a mixer (e.g., a quadrature mixer) which converts the 40-MHz channel to the baseband or a low frequency band for further processing. An oscillator 9 produces a signal of suitable for the frequency conversion. The output of mixer 8 provides the converted channel at the desired low frequency, with the converted carrier f2 located at the difference frequency f2=f1−fo.

The sum signals produced by the mixing are removed by a low-pass filter 10. The low-pass filter 10 is followed by an analog-to-digital converter 11, to which a digital signal processing unit 12 is connected. Dashed arrows in FIG. 10 represent interference signals fn that may be contained in the output of mixer 8. To be able to reject these interference signals, low-pass filter 10 must have a very steep skirt so as to be able to sufficiently suppress even very close interference signals fn. Possible direct interference signals are: the oscillator signal fo, which has a high amplitude, the output signal from tuner 6, including insufficiently attenuated adjacent channels, signals locked to the digitization clock, and signals from signal processing unit 12. In addition, there are indirect interference signals of smaller amplitude produced by mixing and by harmonics of existing signals. Via parasitic mixing at nonlinear characteristics, these signals may also get close to the baseband. With the invention, the necessary steep-slope low-pass filters can be realized, which, being active filters, are easy to calculate, have relative low current consumption, and are an essential requirement of the monolithic integrable mixer 8 with subsequent digitization and signal processing.

Although the present invention has been shown and described with respect to several preferred embodiments thereof, various changes, omissions and additions to the form and detail thereof, may be made therein, without departing from the spirit and scope of the invention.

What is claimed is:

1. An active filter circuit having a signal input (L1), said active filter circuit comprising:
   an operational amplifier (Op) that includes a transconductance amplifier having a transconductance ($g_m$) controlled by a bias circuit to be inversely proportional to a value of a transconductance determining resistor $R_b$ within said bias circuit, wherein said operational amplifier (OP) has a frequency response that has a low-pass characteristic controlled by said transconductance ($g_m$);
   an RC network that includes
      a first resistor ($R_1$) connected between the signal input (L1) of said filter circuit and an inverting input of said operational amplifier (Op), and a first capacitor ($C_1$) connected between said inverting input and a fixed reference potential;
      a second resistor ($R_2$) and a second capacitor ($C_2$) connected between said inverting input and an output of said operational amplifier (Op), which output also forms the signal output of said filter circuit; and a noninverting input of the operational amplifier (Op) is connected to the fixed reference potential.

2. A filter circuit of claim 1, wherein said RC network and said operational amplifier (Op) are parts of a single monolithic integrated circuit, wherein frequency-response-determining resistors and capacitors of said RC network and of said operational amplifier are fabricated by the same fabrication processes.

* * * * *